United States Patent [19]

Ikata et al.

[11] Patent Number: 5,281,883
[45] Date of Patent: Jan. 25, 1994

[54] SURFACE ACOUSTIC WAVE DEVICE WITH IMPROVED JUNCTION BONDING AND PACKAGE MINIATURIZATION

[75] Inventors: Osamu Ikata; Yoshio Satoh; Tsutomu Miyashita; Mitsuo Takamatsu; Takashi Matsuda, all of Kawasaki, Japan

[73] Assignee: Fujitsu Limited, Kawasaki, Japan

[21] Appl. No.: 787,432

[22] Filed: Nov. 4, 1991

[30] Foreign Application Priority Data

Nov. 5, 1990 [JP] Japan ................................ 2-299472

[51] Int. Cl.⁵ .......................................... H01L 41/08
[52] U.S. Cl. .............................. 310/313 R; 310/313 B
[58] Field of Search ....................... 310/313 B, 313 R; 333/195; 439/68-73; 361/400, 403, 413

[56] References Cited

U.S. PATENT DOCUMENTS

| | | | |
|---|---|---|---|
| 3,634,807 | 1/1972 | Grobe et al. | 439/69 |
| 3,885,173 | 5/1975 | Lee | 310/313 R |
| 4,451,753 | 5/1984 | Ogawa et al. | 310/315 |
| 4,545,610 | 10/1985 | Lakritz et al. | 439/69 |
| 4,736,128 | 4/1988 | Takoshima et al. | 310/313 R |
| 4,737,742 | 4/1988 | Takoshima et al. | 333/150 |
| 4,864,470 | 9/1989 | Nishio | 361/400 |
| 4,949,224 | 8/1990 | Yamamura et al. | 439/69 |
| 5,006,792 | 4/1991 | Malhi et al. | 439/71 |
| 5,057,969 | 10/1991 | Ameen et al. | 361/400 |
| 5,121,299 | 6/1992 | Frankeny et al. | 361/413 |

FOREIGN PATENT DOCUMENTS

| | | | |
|---|---|---|---|
| 0367181 | 5/1990 | European Pat. Off. | |
| 64-88546 | 4/1989 | Japan | G03C 5/08 |
| 64-91135 | 4/1989 | Japan | G03C 1/74 |
| 4006841 | 1/1992 | Japan | 361/403 |

OTHER PUBLICATIONS

Patent Abstracts of Japan, vol. 7, No. 200 (E-196), Sep. 3, 1983, & JP-A-58-97840.
Patent Abstracts of Japan, vol. 14, No. 493 (E-0995), Oct. 26, 1990, & JP-A-02-203612.

Primary Examiner—Mark O. Budd
Assistant Examiner—Thomas M. Dougherty
Attorney, Agent, or Firm—Nikaido, Marmelstein, Murray & Oram

[57] ABSTRACT

A surface acoustic wave device in which a surface acoustic wave device element is arranged with interdigital electrodes on a piezoelectric substrate is packaged in a package provided in a metal pattern. Metal bumps are formed on a bonding pad section of the surface wave device element and the metal bumps are contact connected with the metal pattern of the package.

16 Claims, 14 Drawing Sheets

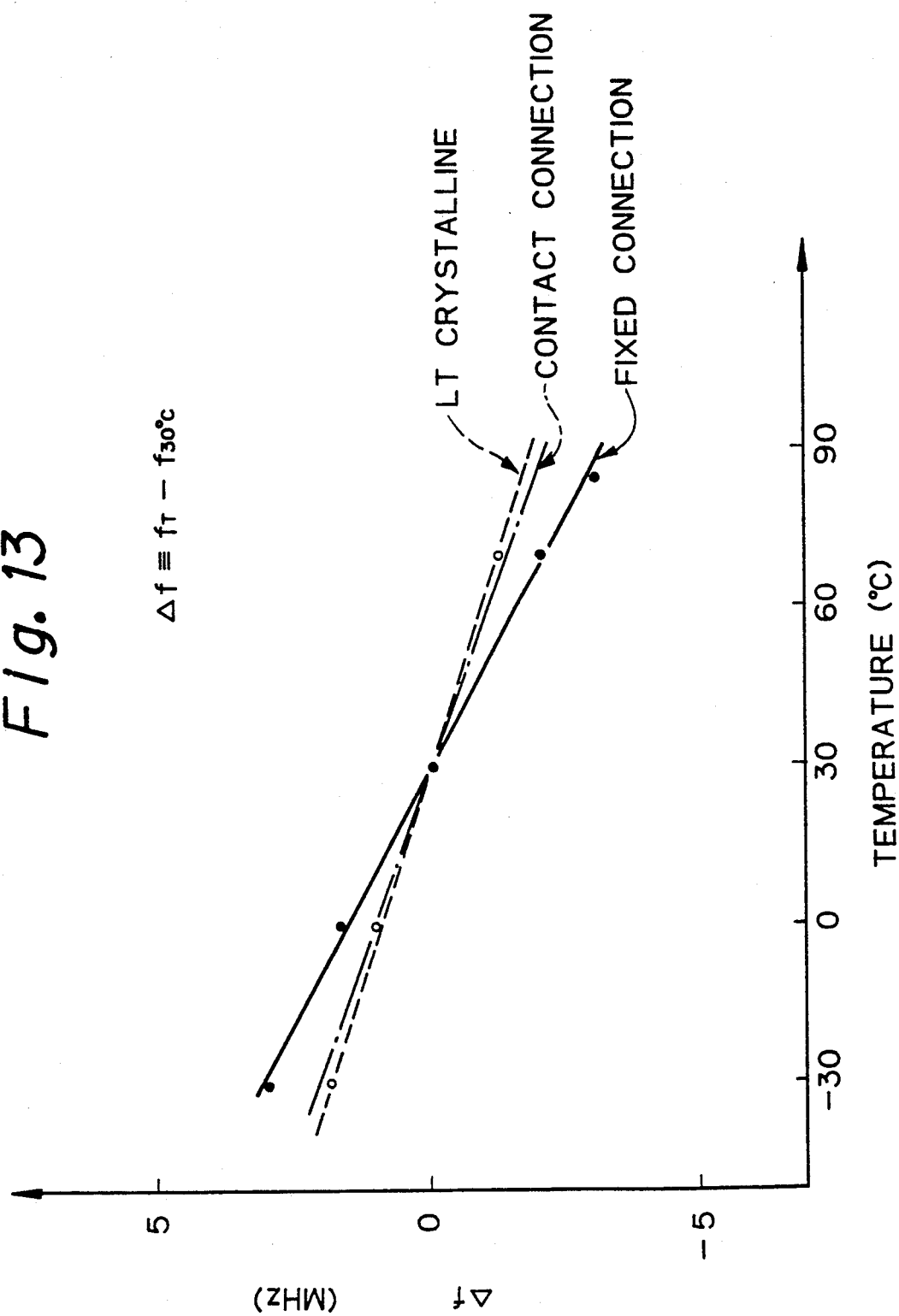

SURFACE ACOUSTIC WAVE DEVICE WITH IMPROVED JUNCTION BONDING AND PACKAGE MINIATURIZATION

BACKGROUND OF THE INVENTION

1. Field of the Invention

The present invention relates to a surface acoustic wave device adapted for a high frequency electronic device, and particularly, to a surface acoustic wave device that has its preferred performance adapted for use in the field of a land mobile radio telephone systems or portable radio telephone systems and can be manufactured by simplified bonding processes to improve reliability and is suitable for mass production.

2. Description of the Related Art

A surface acoustic wave device, such as a surface acoustic wave filter, is a three terminal or four terminal type element that has an electrode for inputting and is outputting and formed of Al and so forth on a piezoelectric substrate having a large electromechanical coupling coefficient and a relatively small temperature coefficient in the frequency, such as 36° Y-X LiTaO$_3$ monocrystalline substrate.

There are many interdigital electrodes (also called comb electrodes) having teeth, (i.e., the width (L) of the electrode strip and the interval (S) of the electrode strip), and the pitch (P) of the electrode strip, in a design of normally L=S=$\lambda$/4, P=$\lambda$/2 assuming that the wavelength of the surface wave is $\lambda$. For example, in order to obtain 836 MHz of center frequency, $\lambda$=4.8 $\mu$m is derived from the acoustic velocity 4090 m/s of X propagating surface wave under the interdigital electrode on the substrate. Thus, the pitch of the electrodes becomes 2.4 $\mu$m and the width and interval of the electrodes becomes 1.2 $\mu$m.

Typical devices have a pair of comb electrodes for input and output opposing each other. However, in a certain fields of use, such as in the field of mobile radio telephones, portable radio telephone and so forth, surface acoustic wave filters having a low amplitude attenuation (for example, less than or equal to 3 to 5 dB of insertion loss) and high suppression (for example, 24 to 25 dB of attenuation magnitude out of a pass band) in a wide range (for example, wider than or equal to 25 MHz of pass band at a center frequency higher than or equal to 836 MHz).

Various methods have been proposed in order to satisfy the foregoing performance. As one of the typical methods, there is the surface acoustic wave filter having a multi-electrode construction (see M. Lewis, 1982 Ultrasonic Symposium proceedings, P12, for example).

FIG. 1 shows an electrode pattern in the conventional surface acoustic wave device, which illustrates the surface acoustic wave filter with multi-electrode construction (example of 5 inputs-4 outputs). In the drawing, 1' denotes a device element, such that the comb electrodes 15 constituted of input and output electrodes arranged alternatively on 36° Y-X LiTaO$_3$ monocrystalline piezoelectric substrate. The device element is thus of a multi-electrode construction having five stages at the input side and four stages at the output side. The signal side electrode terminals are connected to an input terminal pad 11'a and output terminal pad 11'b which are, in turn, connected to external circuits. Although it is not illustrated, reflectors may be provided at both sides for improving the characteristics.

The reference numeral 11'c denotes grounding electrode strip pads formed electrically independent of each other.

The reference numeral 111' denotes a metal pattern for shielding formed surrounding the periphery of the element except for the input and output terminal pads 11'a and 11'b.

These comb electrodes, such as terminal pad and metal pattern and so forth, are typically formed simultaneously in photo-lithographic technology by deposition of the same metal, such as Al or Al-Cu alloy. It should be noted that the illustrated comb electrode is of a so-called normal type-normal construction that has an equal overlapping length of comb electrode strips. Width and number of the electrode strips on the drawing should not be considered accurate and are illustrated for simplification of the drawing.

FIGS. 2A and 2B show an example of practical installation of the conventional surface acoustic wave device. In the drawing, the reference numeral 1' denotes the above-mentioned device element in multi-pole construction. The reference numeral 2' denotes a package that comprises a ceramic box type container formed with a metallic wiring pattern 21' on the intermediate portion of the inner wall, for example (normally, this metallic wiring pattern is formed in a pattern corresponding to that of the terminal pads of the device element 1', and is connected to a not shown external terminal of the package). In the practical installation of the element, after die bonding the device element 1' onto the bottom of the package 2', connection is established between the input terminal pad 11'a and the output terminal pad 11'b (including the grounding metal pattern 111' for shielding if necessary) of the device element 1' and the metallic wiring pattern 21' by means of wires 7. Finally, the metallic lid plate 20' is sealed and fitted to complete the surface acoustic wave device, such as the multi-electrode construction of the surface acoustic wave filter.

However, in the above-mentioned conventional surface acoustic wave device, a space for wire bonding is required in the package. Particularly, in the multi-electrode construction of the device, there are many terminal pads and accordingly an increased number of wire bondings is required. Therefore the amount of required space increases. Furthermore, as a result of the enhancement in the working frequency range of the device to be used, the size of the comb electrodes and the terminal pads becomes smaller. Thus, the making of a junction by wire bonding becomes more difficult. Also, checking the quality of bonding becomes difficult. Furthermore, a problem arises in that the miniaturization of the surface acoustic wave device is frustrated due to large size of the package in proportion to the size of the device element.

The above-mentioned problems can be solve by a surface acoustic wave device housing a surface acoustic wave device element 1 which includes an electrode 15 formed on a piezoelectric substrate 10 in a package 2. The surface acoustic wave device comprises a metal bump 11 being formed on a bonding pad section of the surface acoustic wave device element 1, and the metal bump 11 being contact connected with a metal pattern 21 of the package 2. Practically, the metal pattern 21 may be formed on a lid plate 20 or bottom plate 22 of the package 2, or, as an alternative, a plurality of metal bumps 11 for grounding may be contact connected with the metal pattern 21. Also, a grounding bump pattern 111 may be formed along the periphery of the surface of the surface acoustic wave device element 1, on which the electrode is arranged. Alternatively, the surface acoustic wave device element 1 formed of the grounding bump pattern 111 may be contact connected with the metal pattern, and the whole element may be coated with a resin. Furthermore, a recess 200 or projection 201 for positioning of the surface acoustic wave device element 1 is provided on the metal pattern 21.

According to the present invention, since the metal bump 11 is provided on the terminal pad of the surface acoustic wave device element 1, it is not necessary to perform wire bonding at packaging and thus facilitate installation of the element. Particularly, this is effective for the multi-electrode construction type and can provide a higher reliability.

Also, since it is not necessary to provide a space for wire bonding in the package 2, the device can be made compact. Furthermore, it is simple to perform testing of the connection of the signal lines and grounding lines by means of a tester, and can improve isolation between an input and an output by providing the grounding metal pattern 21c.

BRIEF DESCRIPTION OF THE DRAWINGS

FIG. 13 is a Δf vs. temperature characteristic curve in the case of contact connection and fixed connection to LiTaO$_3$ monocrystalline substrate;

DETAILED DESCRIPTION OF THE PREFERRED EMBODIMENTS

FIG. 3 shows the first embodiment of the present invention, in (A) to (F) of this figure, a surface acoustic wave device chip, a package and packaging are schematically shown in order.

Figure 1:
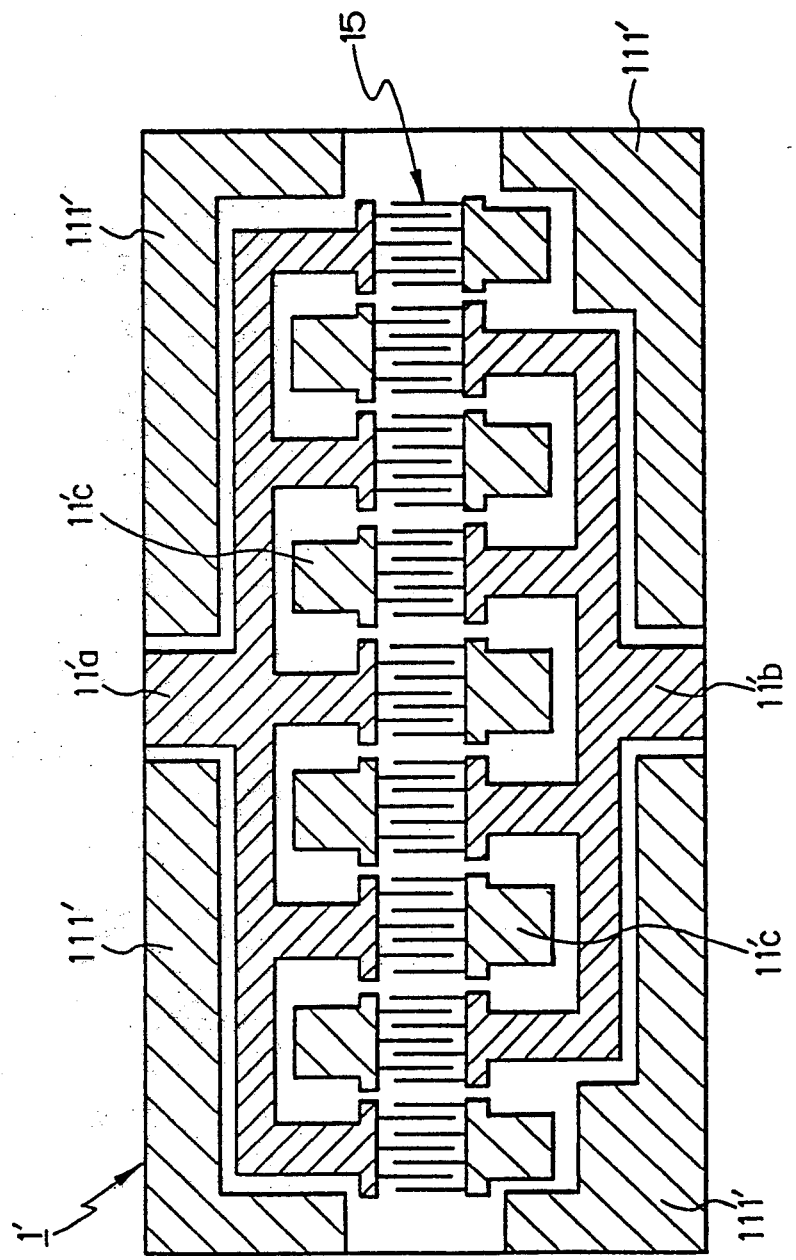
FIG. 1 is a view illustrating an electrode pattern in a conventional surface acoustic wave device.
Figure 2A:
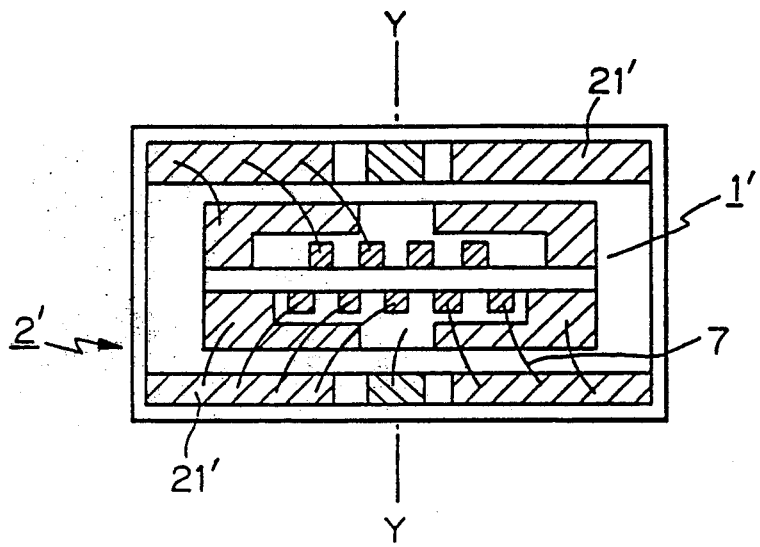
FIG. 2 is a plan view (FIG. 2(A)) and a Y—Y direction cross sectional view (FIG. 2(B)) of the conventional surface acoustic wave device element.
Figure 2B:
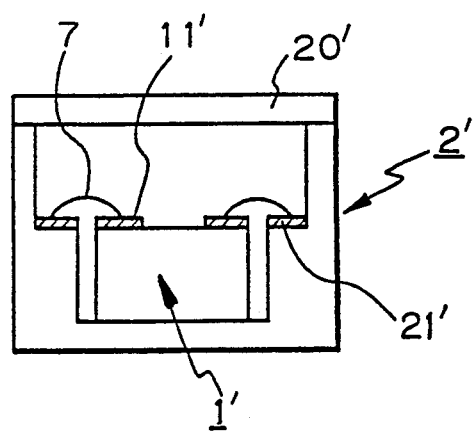
Figure 3A:
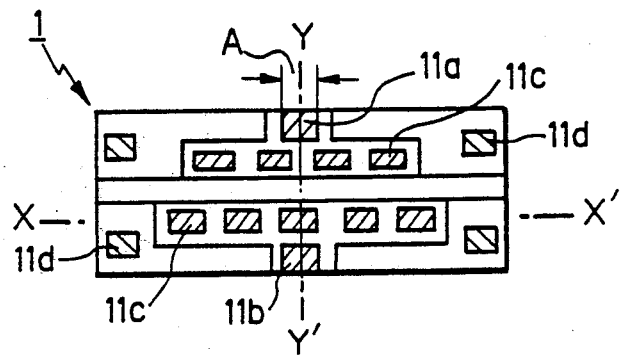
FIGS. 3(A) to (F) illustrate views of a surface acoustic wave device in accordance with the present invention, that is, a plan view (FIG. 3(A)), an X—X' direction cross sectional view (FIG. 3(B)), a Y—Y' direction cross sectional view (FIG. 3(C)), a back view of a package lid plate (FIG. 3(D)), a Y—Y' direction cross sectional view in FIG. 3(D) (FIG. 3(E)), and a cross sectional view showing a sealing state of the package (FIG. 3(F))
Figure 3B:
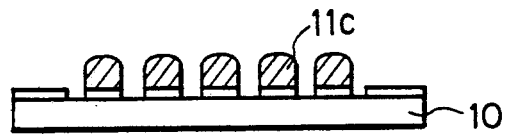
Figure 3C:
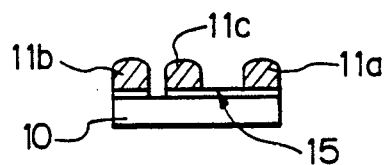
Figure 3D:
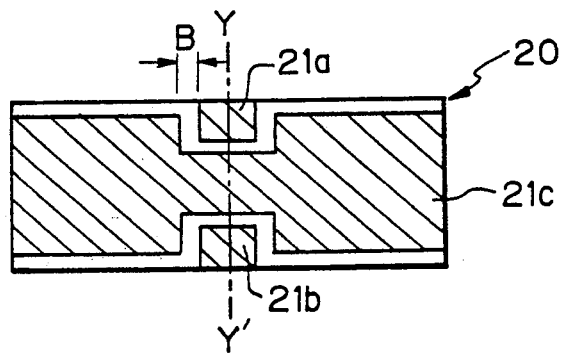
Figure 3E:
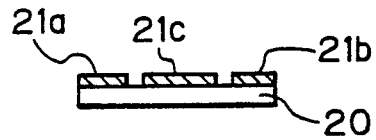
Figure 3F:
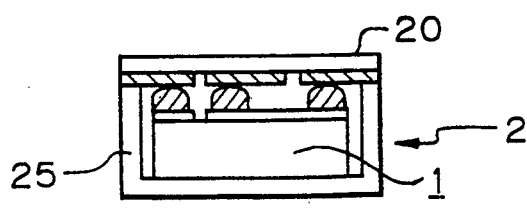

In the plan view of FIG. 3(A), the reference numerals 11a and 11b denote metal bumps provided on an input and output terminal pad. The reference numerals 11c and 11d denote metal bumps provided on a grounding terminal pad and a grounding pattern. The metal bumps are respectively formed of Au, for example. FIGS. 3(B) and 3(C) are X—X' and Y—Y' and are cross sections of the element shown in FIG. 3(A). The reference numeral 15 denotes a comb electrode forming a propagation path of a surface acoustic wave. FIG. 3(D) shows an example of the back side view of a lid plate. The reference numeral 20 denotes a ceramic plate formed with input and output metal patterns 21a and 21b and a grounding metal pattern 21C formed of Au layer, for example. The Y—Y, cross section of the lid plate is shown in FIG. 3 (E). FIG. 3 (F) is a cross section of the package in the enclosed condition, in which the surface wave device 1 is die bonded on the bottom of a ceramic box shaped container 25. Each of the metal bumps 11 on the surface wave device 1 is made in contact with each metal pattern 21 of the lid plate 20 and interconnected therewith by depressing. Simultaneously, the periphery of the lid plate 20 and the upper edge of the package 2 is bonded with a metal or resin (not shown) for completing a packaging of the element (not shown in the figure). In this case, an upper part of a propagation area 15 of the surface acoustic wave is spaced from the lid plate 20 by a distance equal to a height of the bump, thus producing no deterioration of performances. It should be noted that, for simplification of the drawing, external connection terminals are omitted from the illustration. As can be appreciated from the figures, the connection of the element can be significantly simplified and is made compact. Also, because of no possibility of wire breakage, it may hold increased yield and reliability. It should be noted that although the foregoing discussion is given for the process in which the lid plate 20 is connected with the metal bump 11 after die bonding the surface acoustic wave device 1 onto the bottom of the container 25, it is, of course, a possible alternative that the element and the lid plate via the metal bump 11 are initially connected, and subsequently, the container 25 is sealed and enclosed.

Figure 4:
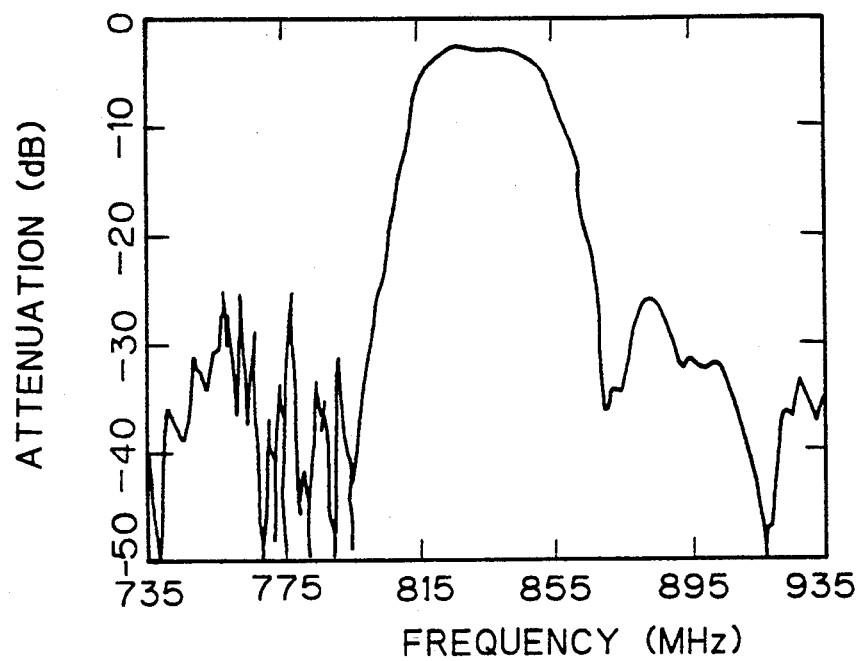
FIG. 4 shows a pass band characteristics of an embodiment of the invention.
Figure 5:
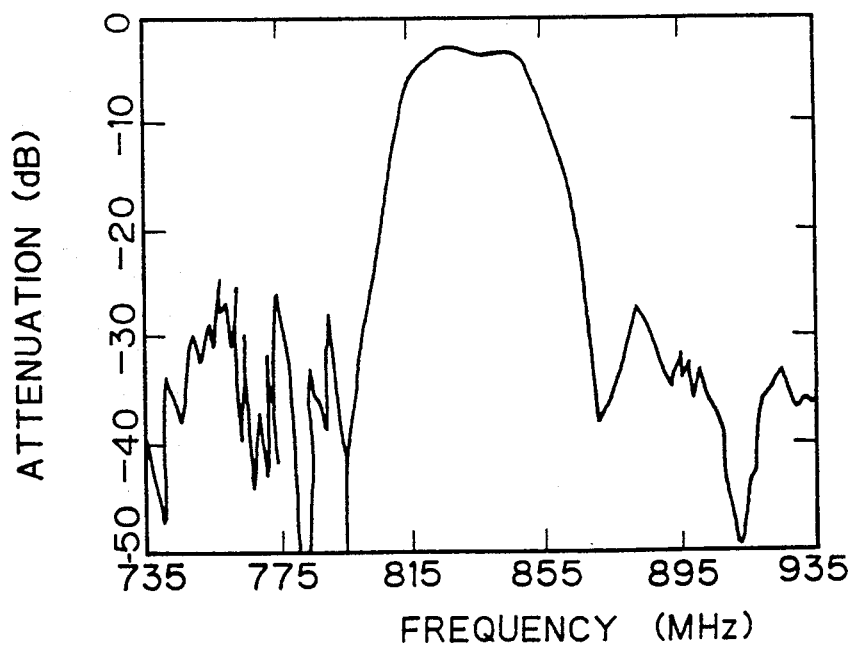
FIG. 5 shows a pass band characteristics of a filter in the conventional surface acoustic wave device.

FIG. 4 shows the pass band characteristics of an embodiment of the invention, and FIG. 5 shows the pass band characteristics of the conventional surface acoustic wave filter, which are shown for comparison with respect to the case where the identical design of the elements of 7 inputs—6 outputs are used. There can be seen no noticeable difference. This demonstrates a remarkable advantage to be obtained by implementation of the element and the package according to the present invention, without causing any drawbacks.

When the intervals (B) between the metal patterns 21a, 21b of the signal line and the metal pattern 21c are made smaller than the width (A) of the metal bumps 11a, 11b, precise positioning of the metal bumps and the metal patterns of the package by checking conduction between the metal patterns 21a, 21b for signal lines and the grounding metal pattern 21c is possible.

Figure 6:
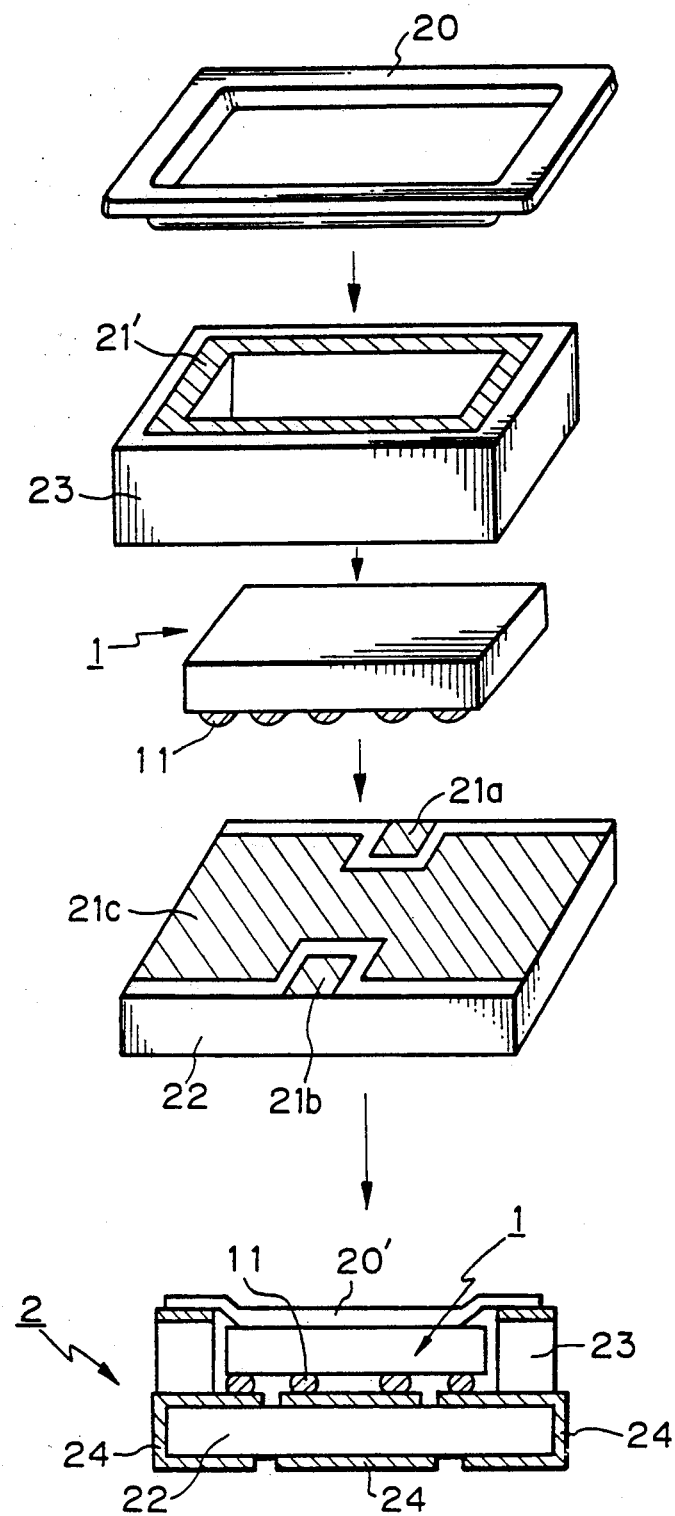
FIG. 6 is an illustration showing the second embodiment of the invention.

FIG. 6 shows a second embodiment of the present invention, which is shown clearly with (partially sectioned) an assembling perspective view of the device.

In FIG. 6, reference numeral 20' denotes a lid plate made of a metal, 23 a frame made of ceramic, 21' a metal pattern formed on an upper end face of the ceramic frame 23, 22 a bottom plate made of ceramic, and 24 a connection terminal to an external circuit. It should be equivalent in parts those discussed with respect to the preceding figures and will be represented by the same reference numerals and a discussion of the equivalent parts will be omitted. The shown embodiment is an example of how to connect the surface acoustic wave device element 1 to the bottom plate 22 via the metal bump 11, the principle and effect of which is similar to those of the foregoing first embodiment.

Figure 7:
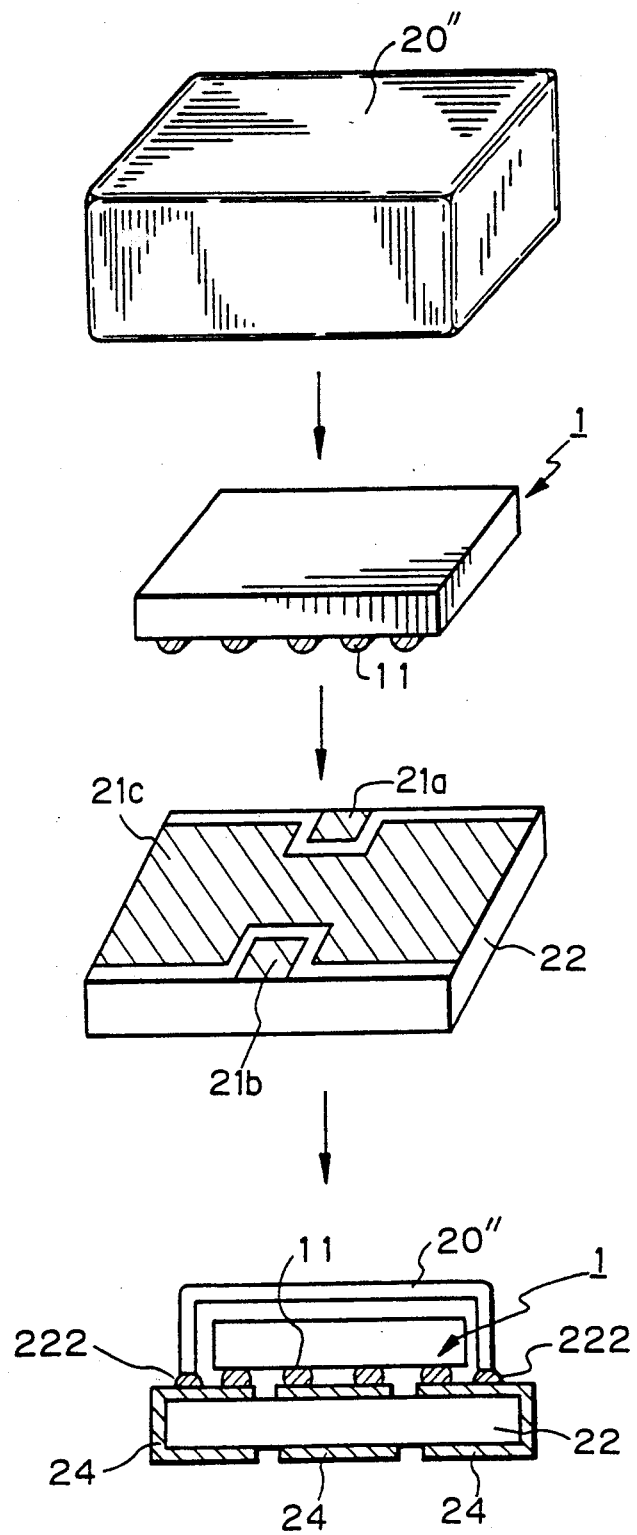
FIG. 7 is an illustration showing the third embodiment of the invention.

FIG. 7 shows a third embodiment of the present invention, which is illustrated clearly by the (partially sectioned) assembling perspective view similar to the former figure.

In the figure, the reference numeral 20" denotes a cap made of a metal, for example. The reference numeral 222 denotes a bonding material of metal or resin for sealing and bonding the cap 20" and the bottom plate 22. This embodiment is essentially similar in construction to the foregoing second embodiment and can be selectively used therewith depending upon the way of use.

Figure 8A:
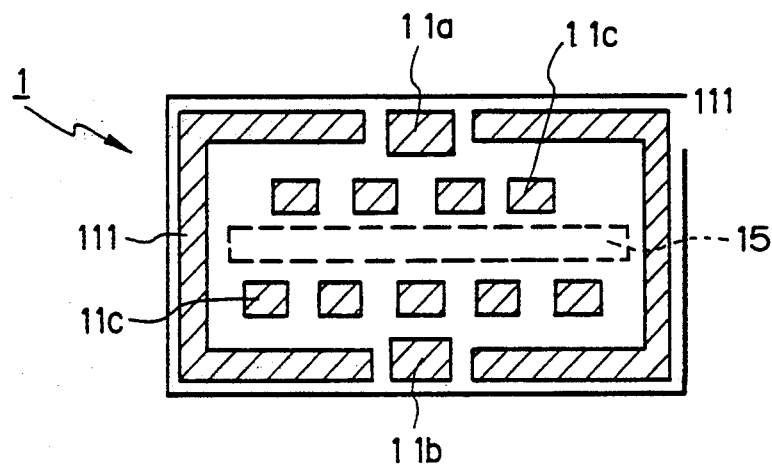
FIGS. 8(A) and 8(B) are an illustration showing the fourth embodiment of the invention.
Figure 8B:
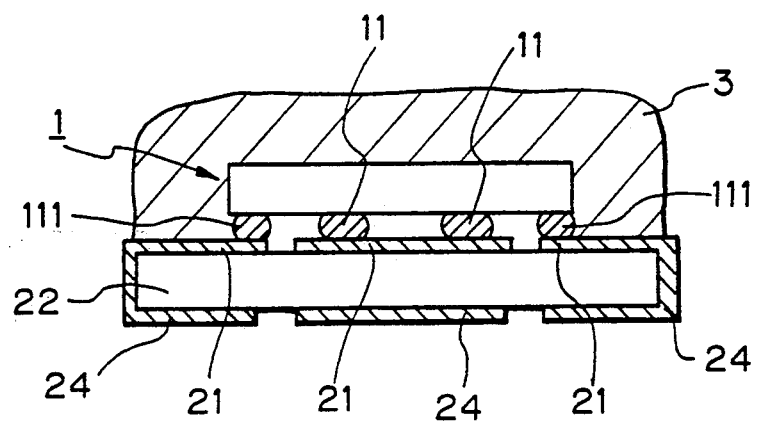

FIG. 8 shows the fourth embodiment of the present invention. In this figure FIG. 8 (A) shows a plan view of the element, and 8 (B) shows a cross section of the device. In the drawing, the portion enclosed by the broken line represents a propagation path region of the surface acoustic wave formed by the comb electrode 15. The reference numeral 111 denotes a grounding bump pattern, formed with line-shaped bulged portions of Au and so forth and extending along the peripheral portion of the element except for the portion of the metal bumps 11a and 11b.

By providing the grounding bump pattern 111, the shielding ability of the element can be enhanced. Accordingly, when the surface wave device 1 is connected to the bottom plate 22 provided thereon the metal pattern 21 (similar in case of the lid plate) through the metal bump 11 and the grounding bump pattern 111, the resin will not enter the inside of the element even when the outer surrounding is coated by an outer resin layer 3. Also, the characteristics will not be adversely affected even when the cap of metal or so forth is not provided. A metal layer may be formed on the surface acoustic wave device at a side opposite the operational surface for providing a further enhanced shielding effect.

Figure 9A:
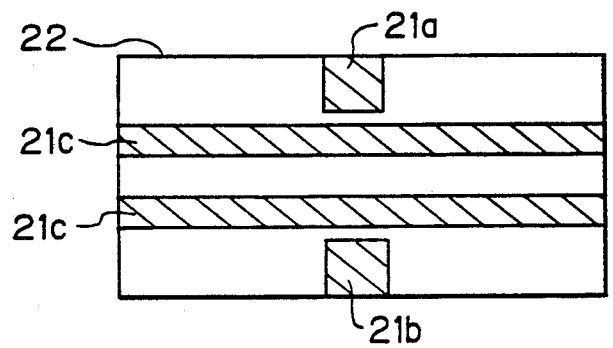
FIGS. 9(A) and 9(B) are an illustration showing the fifth embodiment of the invention.
Figure 9B:
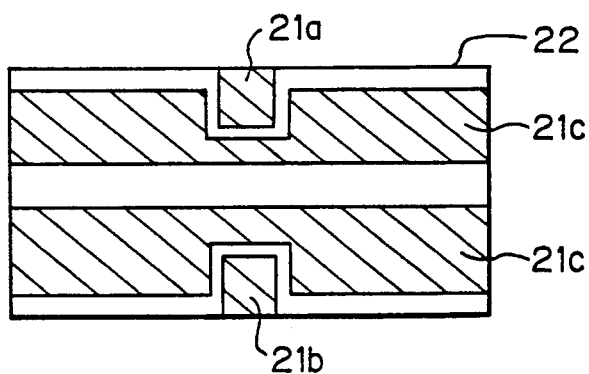
Figure 10A:
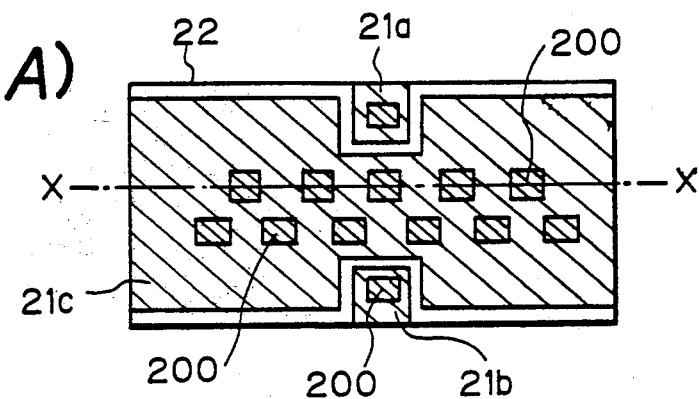
FIGS. 10(A) to 10(D) are an illustration showing the sixth embodiment the invention.
Figure 10B:
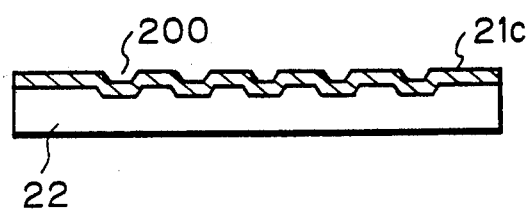
Figure 10C:
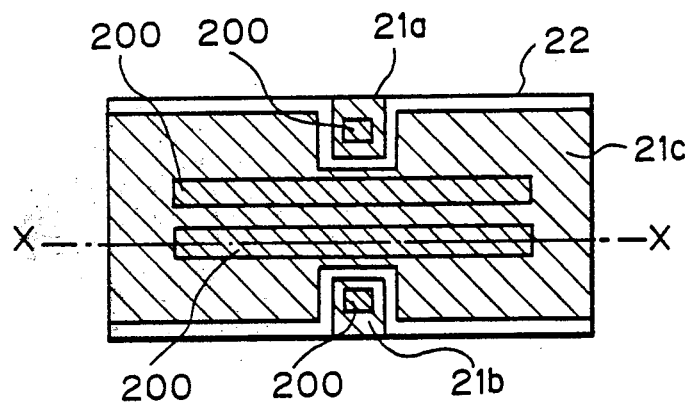
Figure 10D:
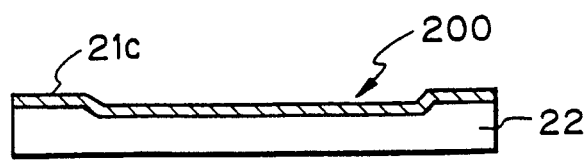

FIG. 9 shows the seventh embodiment of the present invention. In this figure, 9 (A) and 9 (B) show modifications of the metal pattern 21c on the lid plate (or bottom plate) of the package shown in FIG. 3. In either case, the grounding metal patterns 21c are separated into input side and output side. This is effective to use when better isolation between the input and output is desired.

FIG. 10 shows the sixth embodiment of the present invention. In the figure, 200 denotes a recess of 10 to 20 μm in depth, formed in the metal pattern 21 of the bottom plate (or lid plate 20). This recess 200 may be formed solely by the metal pattern 21, or as an alternative, may be formed in the ceramic substrate per se located therebelow. FIG. 10(A) shows the recess 200 formed corresponding to the metal bumps 11 of the surface wave element 1. On the other hand, FIG. 10(C) shows an elongated recess 200 used for the grounding metal bump. In zither case, since the metal bumps engage with the recess 200, it facilitates the positioning of the element and thus make it stable.

Figure 11A:
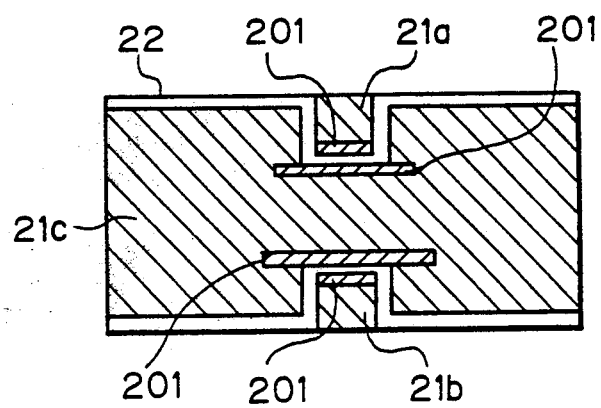
FIGS. 11(A) and 11(B) are an illustration of the seventh embodiment of the invention.
Figure 11B:
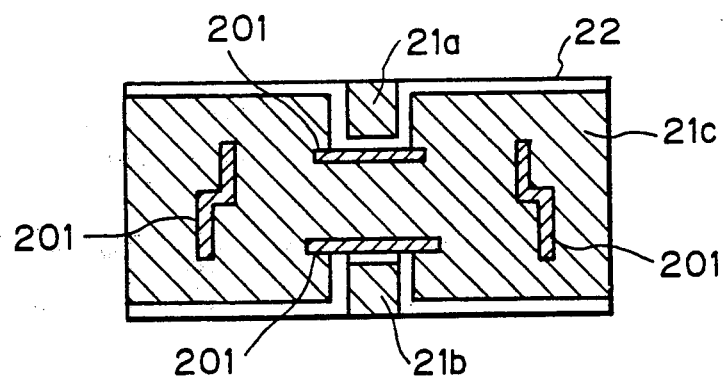
Figure 12A:
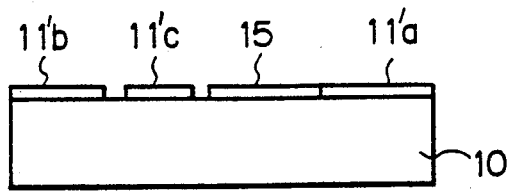
FIGS. 12(A) to 12(E) are an illustration showing example of a method of forming a bump in the invention.
Figure 12B:
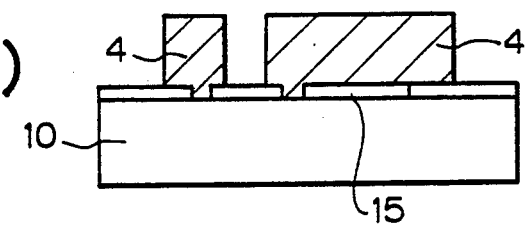
Figure 12C:
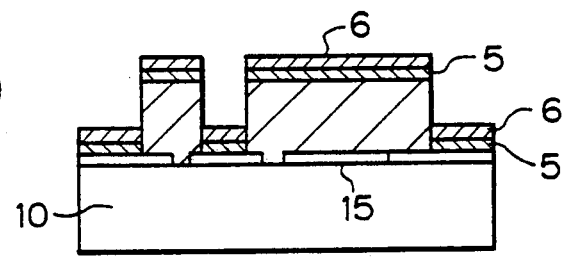
Figure 12D:
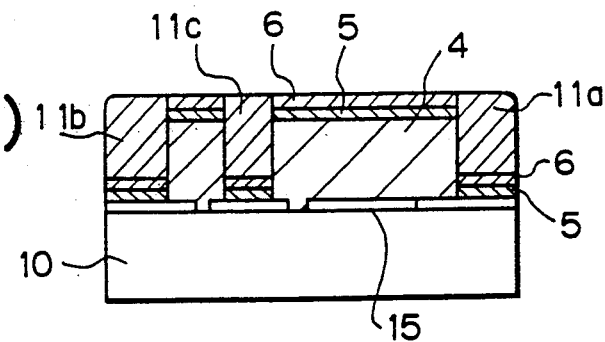
Figure 12E:
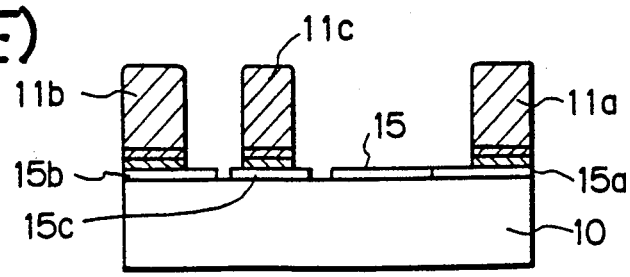

FIG. 11 shows the seventh embodiment of the present invention. Contrary to the foregoing sixth embodiment, projections 201 of a height of about 20 μm, for example, are provided on the metal pattern 21. Similar to the recess 200, the projection 201 can be formed solely with the metal pattern 21. It is of course possible to form the projection with the ceramic substrate per se located below the metal pattern. The effect is essentially equivalent to that of the case where the recess 200 of the sixth embodiment is formed. FIGS. 11(A) and 11(B) show these two variations of the seventh embodiment.

The practical example of formation of the metal bump 11 as set forth above will be discussed hereinafter with reference to the drawings.

FIG. 12 shows an example of a process for forming the bump according to the invention, in which the principle steps are illustrated in order.

Step (1): On the piezoelectric substrate 10 made of 36° Y—X LiTaO₃ monocrystal, a layer, such as 200 to 300 nm thick Al-Cu layer, is formed thereon by deposition. With known photo-lithographic technology, the surface acoustic wave propagation path of multi-electrode construction with the alternatively arranged input and output electrodes comprising comb electrodes 15, such as 5 stage input side and 4 stage output side, and the input terminal pad 11'a and the output terminal pad 11'b connected to respective signal side electrode strips are formed.

Step (2): For the substrate processed as set forth above, a thick resist pattern layer 4 of 30 to 40 μm thick is formed for the area excluding the portion to form the metal bump (for example 100 to 200 μm☐). (See Japanese Patent Application No. 62-244271 and Japanese Patent Application No. 62-248059).

Step (3): For the substrate process as set forth above, an under coat layer 5 for prompting bonding, such as about 25 nm thick of TaMo layer, is deposited, and a metal layer 6, such as about 50 nm thick of Au layer, is deposited as a plated under coat layer, thereon.

Step (4): On the metal layer 6 of the substrate processed as set forth above, 30 to 40 μm thick of Au layer is formed by electroplating, for example.

Step (5): By processing the substrate formed as set forth above with a solvent, such as acetone to remove the thick resist pattern layer 4, the metal bump 11 as shown and for use in the present invention, can be formed.

The foregoing embodiments shows mere examples, it is needless to say that as long as it is consistent with the principal of the invention, any appropriate material, construction and production process or the combination thereof can be used for implementing the invention.

As set forth, according to the present invention, since the metal bump 11 is formed on the terminal pad of the surface device element 1, it becomes unnecessary to perform wire bonding upon packaging and thus facilitates installation. Particularly, this is effective for the multi-electrode construction type and can provide higher reliability. Also, since it is not necessary to provide a space for wire bonding in the package 2, the device can be made compact. Furthermore, it is simple to perform testing of the connection of the signal lines and grounding lines by means of a tester, and can improve isolation between input and output by providing the grounding metal pattern 21c. Therefore, the invention contributes to making the surface acoustic wave device compact and improving quality and reliability.

FIG. 13 is a frequency shift vs. temperature characteristic curve A frequency shift $\Delta f = f_T - F_{30°C}$ is shown in the case of a contact connection and fixed connection caused by a connection of $LiTaO_3$ monocrystalline substrate with a bump.

Figure 14:
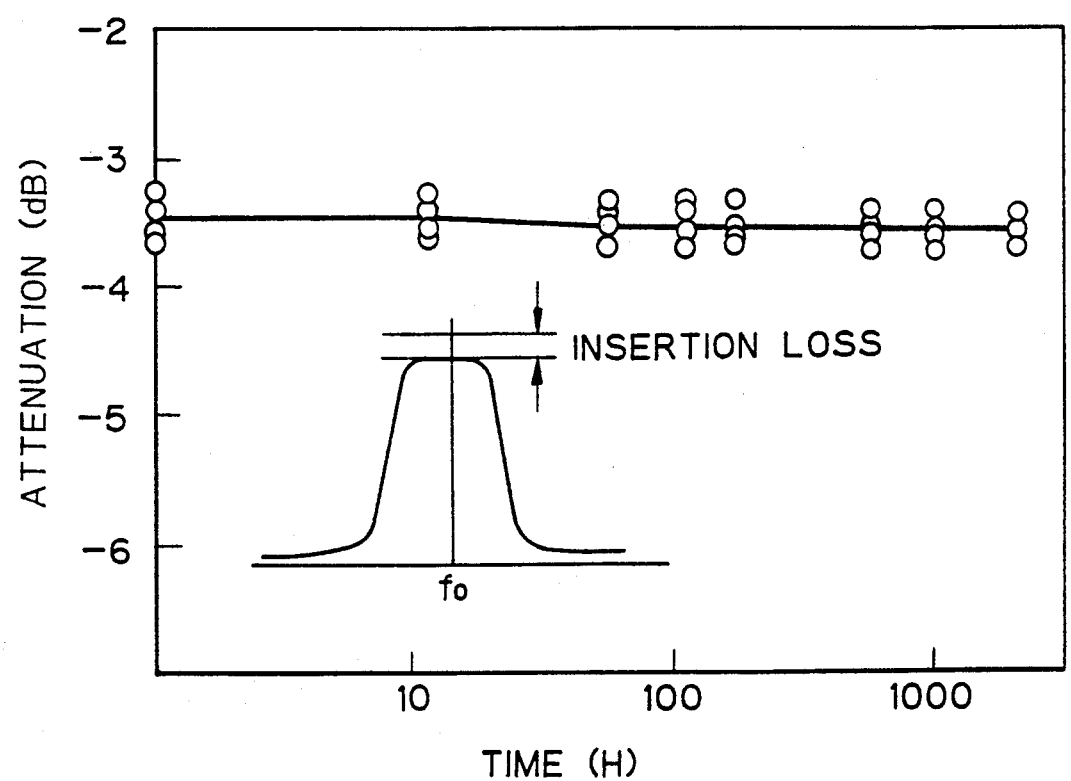
FIG. 14 is an insertion loss vs. time curve of an aging test in 800 MHz band pass filter.

FIG. 14 is an insertion loss vs. time characteristic curve of an aging test in a 800 MHz band pass filter.

Figure 15:
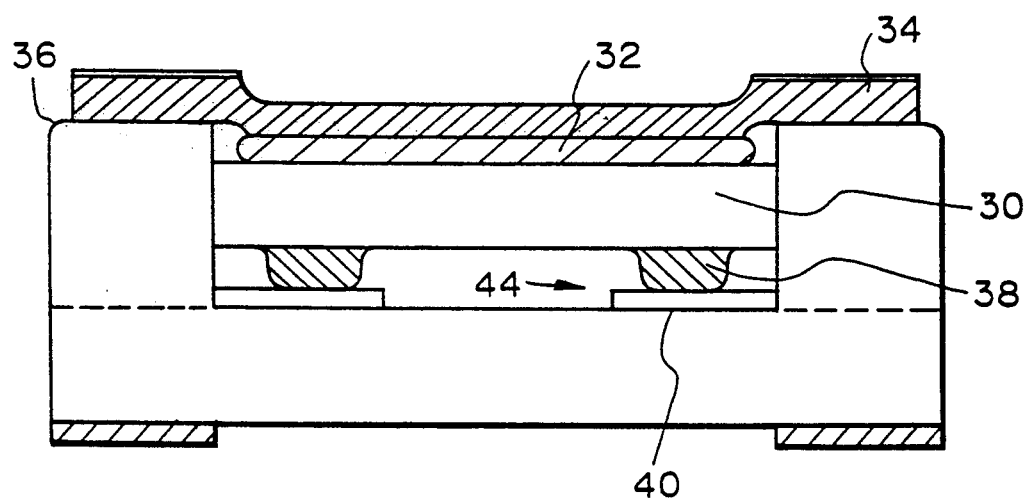
FIG. 15 is an outlined cross sectional view showing contact resistance of a SAW of the invention.

FIG. 15 is an outlined cross sectional view showing contact resistance of the surface acoustic wave device in accordance with the present invention.

In FIG. 15, a lid 34 is mounted to a housing in which nitrogen gas is sealed into the surface acoustic wave device 30 via a molding material 32 by means of Au—Sn sealed member 36 and a bump 38 at the bottom end of the package is contact connected with an electrode 40.

In this case, a contact resistance between a bump 38 and an electrode 40 is nearly equal to zero in the case of high frequency. Because contact between the electrode and the bump is not removed therefrom by an appropriate pressure of a molding member 32 or a lid 34, and even if a thin insulating layer of a depth of up to 0.1 μm at the contacting surface 44 is formed, the electrostatic capacity is more than 10 PF, so in the case of a high frequency of 1 GHz, impedance is no longer affected.

Concerning load data, 200 to 500 gram weight of load is used. From experiment, it has been determined that a contact of less than 200 gr. weight provides a low reliability and a contact of more than 500 gr. weight leads to a destruction of a bump. Durability per one bump amounts to several gr. weight.

We claim:

1. A surface acoustic wave device element for a surface acoustic device, comprising:
    a piezoelectric substrate;
    electrodes formed on a first surface of said substrate;
    input/output and grounding terminal pads formed on the first surface of said substrate.
    a plurality of metal bumps formed on the input/output and grounding terminal pads on the first surface of said substrate;
    a plate having input/output and grounding metal patterns formed on a first surface thereof, said plate being positioned so as contact the plurality of metal bumps with corresponding metal patterns;
    a frame formed so as to surround an outer periphery of said piezoelectric substrate and positioned on the first surface of said plate; and
    a lid positioned with said frame so as to sealably enclose said substrate, said electrodes, said terminal pads, said plurality of metal bumps and the metal patterns between said plate, said frame and said lid, wherein said lid is positioned to press said piezoelectric substrate against said plate so as to maintain electrical connection between said plate and said plurality of metal bumps on said substrate, and
    a distance B between metal patterns for signal lines and a metal pattern for grounding is smaller than widths A of the metal bumps for signal lines of the surface acoustic wave element.

2. A device according to claim 1, wherein said plurality of metal bumps are contact connected with said piezoelectric substrate.

3. A device according to claim 1, wherein said plate having the metal pattern is formed as and positioned relative to said substrate as one of at least a lid plate and a bottom plate of said package.

4. A device according to claim 1 or claim 2, wherein said substrate further includes grounding terminal pads with said plurality of metal bumps contact connected with said metal pattern.

5. A device according to claim 1, wherein a recess or a projection for positioning said surface acoustic wave device element is provided on said metal pattern.

6. A surface acoustic wave device according to claim 1, wherein the grounding terminal pads and corresponding metal bumps are formed on a peripheral area of the first surface of said substrate relative to said electrodes.

7. A surface acoustic wave device according to claim 1, further comprising:
    a housing for sealably enclosing the first surface of said substrate, said electrodes, said terminal pads, said plurality of metal bumps and the metal patterns between said housing and said plate.

8. A surface acoustic wave device according to claim 1, wherein said frame is integrally formed with said plate.

9. A surface acoustic wave device according to claim 1, further comprising:
    a metal cap sealably formed and positioned so as to sealably enclose said substrate, said electrodes, said terminal pads, said plurality of metal bumps and the metal patterns between said plate and said metal cap.

10. A surface acoustic wave device according to claim 1, further comprising:
    an intermediate material positioned between said lid and a top outer surface of said piezoelectric substrate, wherein said material is positioned to press sad piezoelectric substrate in conjunction with said lid against said plate so as to maintain electrical connection between said plate and said plurality of metal bumps on said substrate.

11. A surface acoustic wave device according to claim 1, wherein said grounding terminal pads and the grounding metal patterns with corresponding metal bumps are formed along peripheral areas of said substrate and said plate relative to said electrodes.

12. A surface acoustic wave device according to claim 11, further comprising:
    an outer resin layer formed sealably formed and positioned so as to sealably enclose said substrate, said electrodes, said terminal pads, said plurality of metal bumps and the metal patterns between said plate and said outer resin layer.

13. A surface acoustic wave device according to claim 1, wherein the grounding metal patterns include input grounding metal patterns and output grounding metal patterns.

14. A surface acoustic wave device according to claim 1, wherein the input/output and grounding metal patterns include a plurality of recesses formed and positionally aligned to accommodate corresponding metal bumps.

15. A surface acoustic wave device according to claim 1, wherein the input/output and grounding metal patterns include a plurality of projections formed and positionally aligned to contact corresponding metal bumps.

16. A surface acoustic wave device according to claim 1, wherein said lid is positioned with 200 to 500 gram weight of pressure so as to apply pressure onto said piezoelectric substrate against said plate.

* * * * *